(12) United States Patent
Brass et al.

(10) Patent No.: US 6,972,549 B2
(45) Date of Patent: Dec. 6, 2005

(54) BANDGAP REFERENCE CIRCUIT

(75) Inventors: Eckhard Brass, Unterhaching (DE); Christian Grewing, Sollentuna (SE); Jürgen Oehm, Ratingen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/041,611

(22) Filed: Jan. 24, 2005

(65) Prior Publication Data

US 2005/0184718 A1 Aug. 25, 2005

Related U.S. Application Data

(63) Continuation of application No. PCT/DE03/02377, filed on Jul. 15, 2003.

(30) Foreign Application Priority Data

Jul. 23, 2002 (DE) .............................. 102 33 526

(51) Int. Cl.[7] .............................................. G05F 3/16
(52) U.S. Cl. ..................................... 323/313; 323/316
(58) Field of Search ........................... 323/312, 313, 323/316; 327/538, 539

(56) References Cited

U.S. PATENT DOCUMENTS

| | | | |
|---|---|---|---|
| 5,083,043 A | 1/1992 | Yoshida | |
| 5,706,240 A | 1/1998 | Fiocchi et al. | |
| 6,150,872 A * | 11/2000 | McNeill et al. | 327/539 |
| 6,278,320 B1 | 8/2001 | Vu | |
| 6,507,180 B2 * | 1/2003 | Eguchi | 323/314 |
| 6,815,941 B2 * | 11/2004 | Butler | 323/313 |

FOREIGN PATENT DOCUMENTS

| | | |
|---|---|---|
| EP | 1 154 566 A2 | 11/2001 |
| EP | 0 895 147 B1 | 5/2002 |

OTHER PUBLICATIONS

"A CMOS Bandgap Reference Circuit with Sub-1-V Operation", Hironori Banba, Hitoshi Shiga, Akira Umezawa, Takeshi Miyaba, Toru Tanzawa, Shigeru Atsumi and Koji Sakui, IEEE Journal of Solid State Circuits, vol. 34, No. 5, May 1999, 4 pgs.

* cited by examiner

Primary Examiner—Adolf Berhane
(74) Attorney, Agent, or Firm—Eschweiler & Associates, LLC

(57) ABSTRACT

A bandgap reference circuit is provided in which the conventional current loop with a current mirror for feeding a differential amplifier is replaced by a reference current that flows through a resistor connected to the bias input of the differential amplifier. In conjunction with a simpler construction and suitability for lower supply voltages, the circuit exhibits an improved supply voltage rejection PSRR over the prior art.

15 Claims, 3 Drawing Sheets

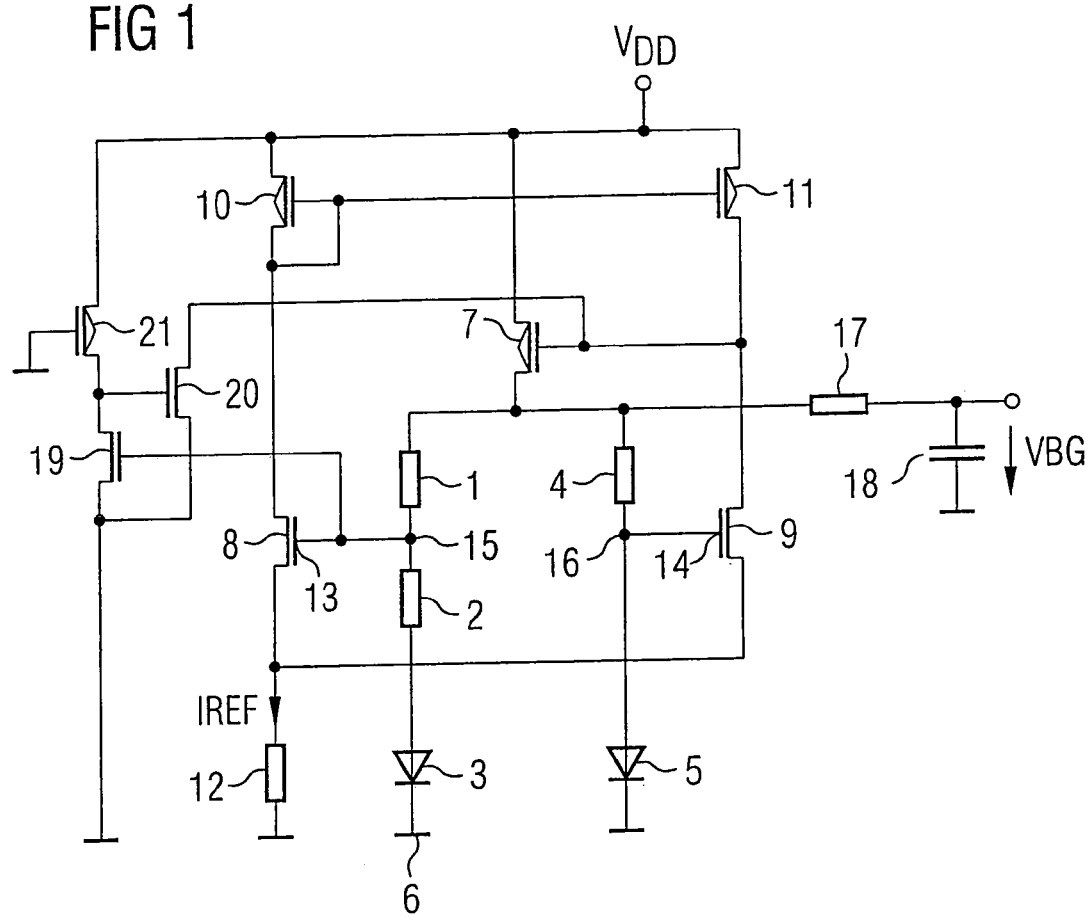

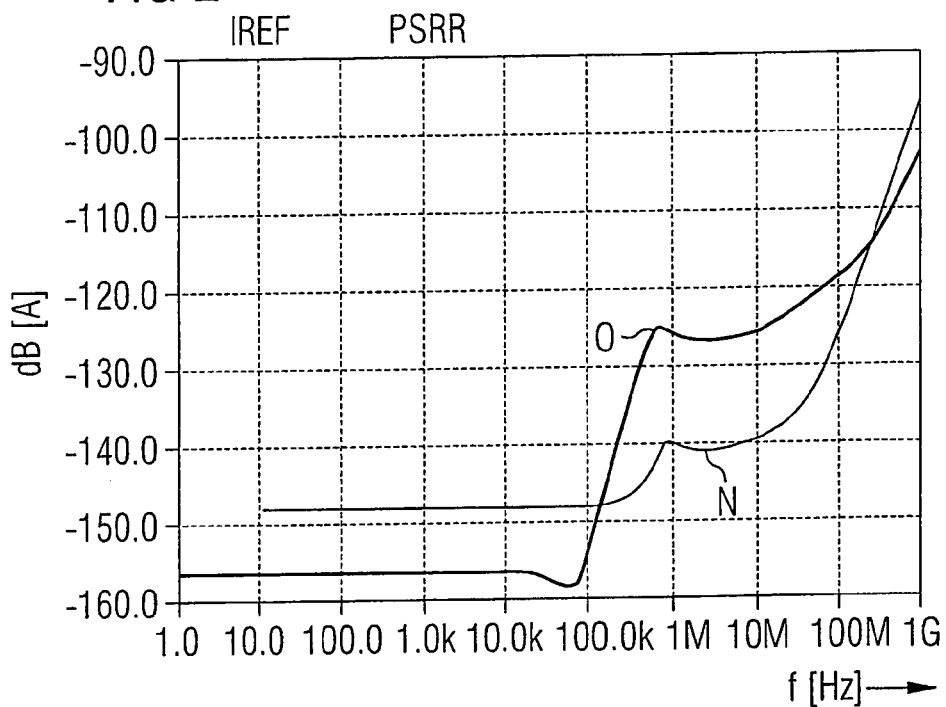
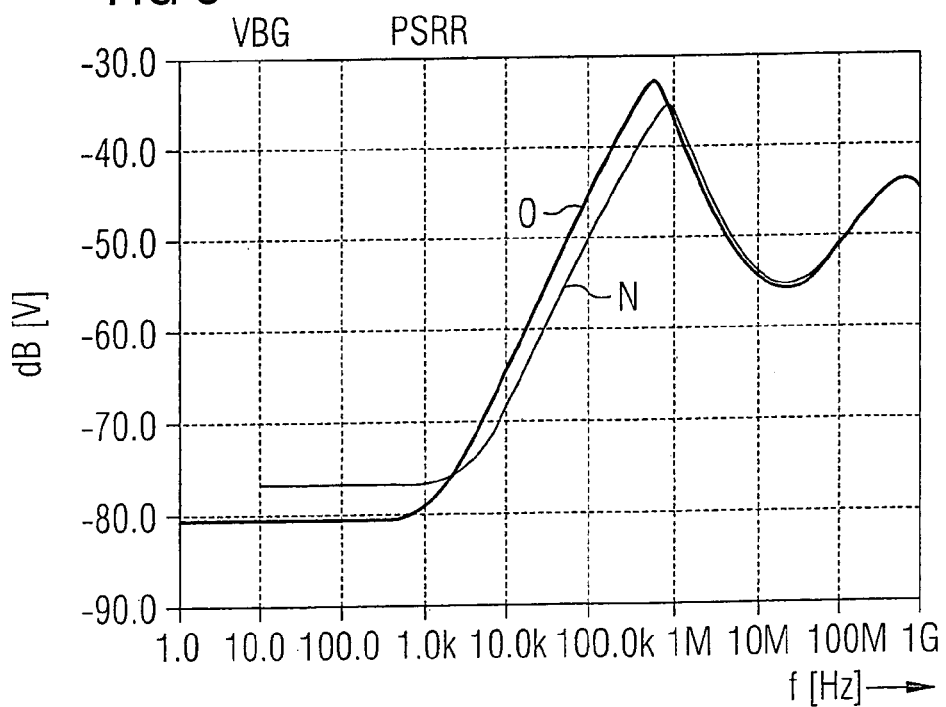

BANDGAP REFERENCE CIRCUIT

REFERENCE TO RELATED APPLICATIONS

This application is a continuation of PCT/DE03/02377, filed Jul. 15, 2003 which was not published in English, that claims the benefit of the priority date of German Patent Application No. DE 102 33 526.5, filed on Jul. 23, 2002, the contents of which both are herein incorporated by reference in their entireties.

FIELD OF THE INVENTION

The present invention relates to a bandgap reference circuit.

BACKGROUND OF THE INVENTION

A bandgap reference circuit of the generic type is specified, for example, in the document H. Banba, H. Shiga et al.: "A CMOS Bandgap Reference Circuit with Sub-1-V Operation", IEEE Journal of Solid-State Circuits, Vol. 34, No. 5, May 1999. The circuit construction of a conventional bandgap reference circuit is shown in the first figure therein. This circuit comprises a regulating circuit having a CMOS operational amplifier and also having diodes and resistors. A pair of input voltages of the operational amplifier is regulated in such a way that the voltages are equal. The two input voltages of the operational amplifier are in each case dependent on the forward voltage of a diode in a respective current branch coupled to the output of the operational amplifier.

The forward voltage of a diode normally has a comparatively high temperature coefficient of, by way of example, minus 2 mV per kelvin at 0.6 volt. In the case of a bandgap reference of the generic type, said temperature coefficient is compensated by a voltage having a temperature coefficient of plus 2 mV per kelvin or some other positive temperature coefficient being added in a correspondingly weighted fashion. Consequently, the output reference voltage of the bandgap circuit, through a suitable choice of resistance ratios in conjunction with the highest possible DC gain of the operational amplifier, is produced as a voltage value that is practically independent of temperature. In this case, the current densities of the diodes in the two current branches are set differently.

In the case of silicon as the semiconductor material, the reference voltage of such a bandgap circuit is normally produced as approximately 1.25 volts.

FIG. 5 of the Banba et al. document cited above illustrates the operational amplifier of the bandgap reference circuit as a circuit diagram at the component level. It can be seen that the operational amplifier is embodied as a differential amplifier using MOS circuit technology and the output signal of the differential amplifier is fed in at the common source node of the amplifier transistors via a current mirror. This has the disadvantage, on the one hand, that a comparatively large number of components are required for the reference current generation of the differential amplifier, and, on the other hand, a disadvantageous current loop is formed which affords a comparatively poor supply voltage rejection of the reference current. The supply voltage rejection is also referred to as PSRR, Power Supply Rejection Ratio.

Another figure of the cited document H. Banba, H. Shiga et al. furthermore indicates a start circuit for switching on the bandgap reference circuit, having an NMOS transistor, the controlled path of which couples the output of the differential amplifier to a reference potential in a manner dependent on a switch-on control signal, which has to be generated by an additional control circuit (not depicted). Such a control circuit normally comprises a multiplicity of further components, in particular transistors and capacitors. Such a start circuit enables a reliable and comparatively fast start-up of the bandgap regulating circuit, but is realized with a comparatively high outlay.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a bandgap reference circuit of the generic type having an improved supply voltage rejection. In particular, the bandgap reference circuit is intended to be suitable for application in mobile devices with a low supply voltage that may be subjected to comparatively large fluctuations.

In accordance with the present invention, the reference current for the differential amplifier is provided by means of a grounded resistor and is not derived from the output signal of the differential amplifier by means of a current loop.

Surprisingly, it is possible to use a resistor as a current source in the case of the bandgap reference circuit described. This is because the inventor has recognized in the present case that the common-mode positions at the tapping points of the current branches enable the current to be generated by means of a resistor.

On account of these common-mode positions of the input signals of the differential amplifier from the current branches of the bandgap reference circuit, the differential amplifier can be operated stably without complicated feedback of the output signal of the differential amplifier. Consequently, the supply voltage rejection of the reference current supply of the differential amplifier is significantly improved and, moreover, the described reference current generation for the differential amplifier is possible with a significantly reduced outlay on components. Instead of three MOS transistors, just one resistor is necessary.

With the described principle of reference current feeding-in in a bandgap reference circuit, current disturbances on account of supply voltage fluctuations occur in the present invention with significantly reduced weighting, namely being merely logarithmically weighted.

Moreover, the formation of a current loop that affords a significantly lower stability with respect to supply voltage fluctuations is advantageously avoided.

The reference current generation with a resistor on which the present invention is based is associated with the additional advantage that the bandgap regulating circuit starts more rapidly and settles more rapidly and the start-up of the reference circuit, when a stable reference voltage is provided at the output, is thus significantly shortened.

In one embodiment of the present reference circuit, provision is made of a start circuit for switching on or starting up said reference circuit. In this case, a first transistor is controlled by the voltage present at the first tapping node and acts on a second transistor in a manner dependent thereon, which second transistor, on the load side, couples the output of the differential amplifier to the reference potential terminal.

The present start circuit requires comparatively few components, has a simple construction and enables an effective and fast start-up of the bandgap reference circuit.

In one example, the first and second current paths in the bandgap reference circuit are connected to one another by their current inputs and are accordingly connected in parallel between a control transistor and a reference potential. The control transistor is connected by its control terminal to the output of the differential amplifier and is connected up by its controlled path to a supply potential terminal, on the one hand, and to the two current inputs of the current paths, on the other hand. The provision of just one control transistor with which the differential amplifier controls the currents in the two current paths affords the advantage of the smaller number of components, on the one hand. On the other hand, however, it is advantageously possible to dispense with having to ensure a good matching tolerance in the case of providing two transistors.

The diodes, depending on the forward voltage of which the bandgap reference circuit operates, are preferably formed as bipolar diodes.

In the case where the circuit is fabricated using CMOS n-type well technology, the diodes are preferably embodied as bipolar transistors whose base terminal is in each case short-circuited with their collector terminal. Consequently, the base-emitter junction of the transistor is provided as the diode.

Apart from the two diodes operating as reference elements, the present bandgap reference circuit is preferably completely embodied using MOS circuit technology.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in more detail below using an exemplary embodiment with reference to the drawings.

In the figures:

FIG. 1 is a schematic diagram illustrating a first exemplary embodiment of a bandgap reference circuit according to the present invention, FIG. 2 is a graph illustrating a frequency response of the supply voltage rejection of the reference current of the differential amplifier, FIG. 3 is a graph illustrating a frequency response of the supply voltage rejection of the bandgap circuit on the output side.

DETAILED DESCRIPTION OF THE INVENTION

Figure 4:
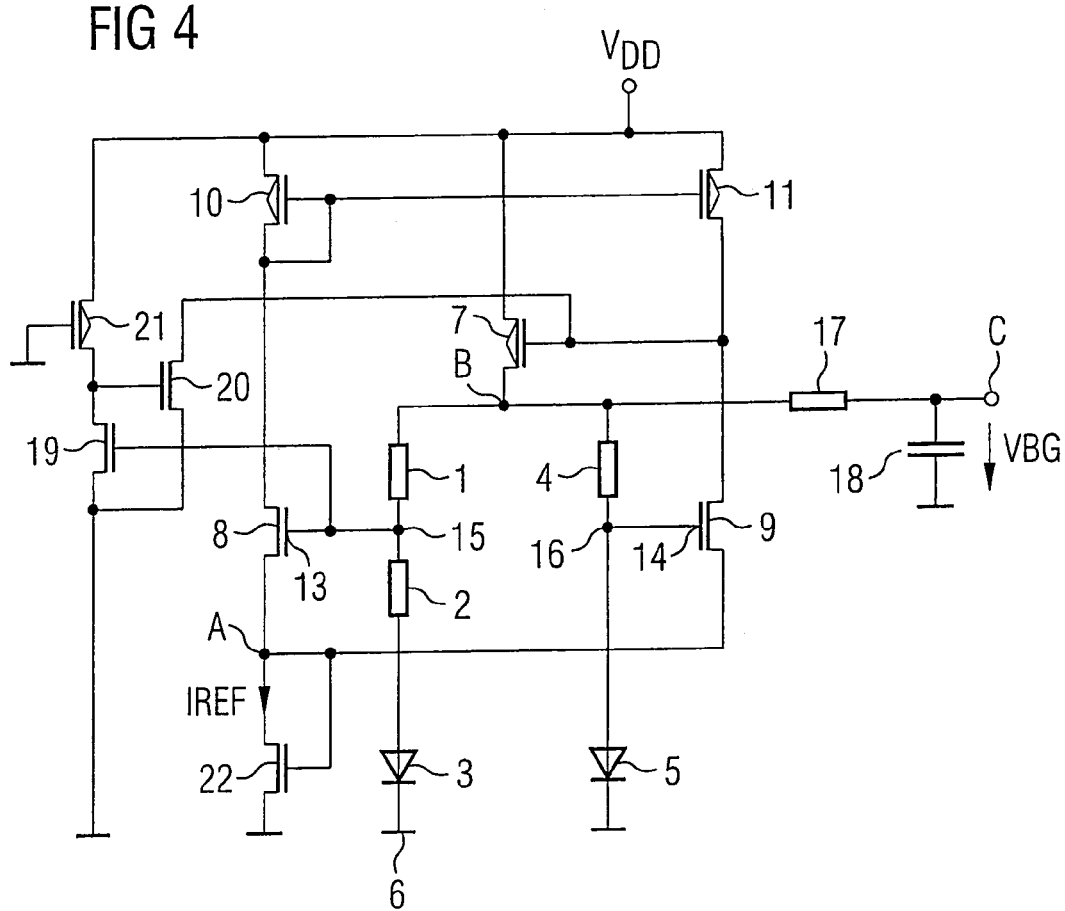
FIG. 4 is a schematic diagram illustrating a second exemplary embodiment of a bandgap reference circuit according to the invention.

FIG. 1 shows an exemplary embodiment of a bandgap reference circuit of the present invention that is constructed using CMOS circuit technology and uses the forward voltage of diodes as a voltage reference. A first current path comprises a series circuit formed by a first resistor 1, a second resistor 2 and a first diode 3. Connected in parallel with this first current path 1, 2, 3 is a second current path 4, 5, comprising a third resistor 4 and also a second diode 5, which are likewise connected to one another in a series circuit. The two current inputs of the current paths 1, 2, 3; 4, 5 are in each case formed at the free terminals of the first and of the third resistor 1, 4, respectively. These current inputs are connected to one another. Furthermore, the cathode terminals of the diodes 3, 5 are in each case connected to a reference potential terminal 6. A control transistor 7 is connected by its load path between a supply voltage terminal VDD and the current inputs of the current paths 1, 2, 3; 4, 5, said control transistor being embodied as a PMOS transistor. The control input of the control transistor 7 is connected to the output of a differential amplifier, which operates as an operational amplifier.

The differential amplifier 8, 9, 10, 11, 12 comprises a first amplifier transistor 8, a second amplifier transistor 9, a current mirror 10, 11 and also a resistor 12, which operates as a reference current source. The two amplifier transistors 8, 9 are embodied as n-channel MOS field-effect transistors and in each case have a control input, the control inputs of the amplifier transistors 8, 9 forming the first and second inputs 13, 14 of the differential amplifier. The controlled paths of the two amplifier transistors 8, 9 are connected to one another by a respective first terminal via the current mirror 10, 11 and, at their second terminals of the controlled paths, are directly connected to one another and are connected relative to reference potential 6 via the reference current source resistor 12. The current mirror transistors 10, 11 are directly connected to one another by their gate terminals and are directly connected to the supply potential $V_{DD}$ by a respective load terminal. The current mirror transistor 10, which is connected up as a diode, is embodied as a p-channel MOS field-effect transistor like current mirror transistor 11.

The first and second inputs 13, 14 of the differential amplifier are connected to a respective tapping point 15, 16 at the first and second current paths 1, 2, 3; 4, 5. The first tapping point 15 is formed at the common connecting node of the resistors 1, 2. The second tapping node 16 is provided between the third resistor 4 and the second diode 5 at the anode terminal thereof.

The output of the bandgap reference circuit of FIG. 1 is formed at the common connecting node of the current input of the first current path 1, 2, 3, the current input of the second current path 4, 5 and the terminal of the controlled path of the control transistor 7 that is connected thereto. An RC element comprising a series resistor 17 and a capacitor 18, which is connected downstream of the resistor 17, is connected to said connecting node relative to the reference potential or ground. The low-pass-filtered bandgap reference signal is provided at the output terminal of the RC element 17, 18.

For the purpose of starting up the bandgap reference circuit, provision is made of a start circuit 19, 20, 21 comprising a first transistor 19, a second transistor 20, and also a transistor 21 connected up as an electrical load. While the first and second transistors 19, 20 are formed as NMOS transistors, the electrical load is a PMOS transistor 21. Transistor 21 and transistor 19 form a series circuit with regard to their controlled paths and are connected between the supply potential terminal VDD and the reference potential terminal 6. The load transistor 21 is likewise connected to the reference potential by its control terminal and is thus always in the on state. The control input of the transistor 19 is connected to the first tapping node 15 of the first current path 1, 2, 3. The second transistor 20 is connected by its control input to the connecting node of the transistors 19, 21 and, on the load side, connects the control input of the control transistor 7 to the reference potential terminal 6.

The operational amplifier, which is formed as a differential amplifier in the present case, always corrects the potentials established at the two tapping points 15, 16 after a settling phase such that they are equal. This has the effect that the forward voltage of the second diode 5 is equal to the sum of the voltages across resistor 2 and diode 3. In this case, the diode 3 is preferably formed as a parallel circuit comprising a plurality of partial diodes. The electrical relations of the circuit of FIG. 1 are described by the formulae below, in which $U_{PTAT}$ designates the voltage equivalent of thermal energy across the resistor 2, k designates Boltzmann's constant, T designates the absolute temperature in kelvins, q designates the elementary charge, $I_{S5}$ designates the current density of the diode 5, $I_{S3}$ designates the current density of the diode 3, $U_1$ to $U_5$ designate the voltages across the resistors 1 to 5, R1, R2 designate the values of the resistors 1, 2 and $U_{BG}$ designates the bandgap voltage.

$$U_{PTAT} = \frac{k \cdot T}{q} \cdot \ln\left(\frac{I_{s5}}{I_{s3}}\right)$$

$$U_1 = R_1 \cdot \frac{U_{PTAT}}{R_2} = \frac{R_3}{R_2} \cdot \frac{k \cdot T}{q} \cdot \ln\left(\frac{I_{s5}}{I_{s3}}\right)$$

$$U_{PTAT} + U_3 = U_5$$

$$U_1 = U_4$$

$$U_{BC} = U_5 + U_1 = U_5 + \frac{R_1}{R_2} \cdot \frac{k \cdot T}{q} \cdot \ln\left(\frac{I_{s5}}{I_{s3}}\right) \stackrel{!}{\approx} 1.25 \text{ V}$$

On the basis of the insight that a signal pair with a suitable, sufficient common-mode position is present at the tapping nodes 15, 16, in accordance with the present invention, the resistor 12 is connected relative to ground at the reference current input of the differential amplifier as a current source. This in turn makes it possible to provide a reference current with particularly good supply voltage rejection (power supply rejection ratio, PSRR) since disturbances affect the supply voltage only in a logarithmically weighted fashion in accordance with the present invention. The following holds true for the reference current $I_{ref}$:

$$I_{ref} = \frac{U_s - U_{GS8}}{R_{12}}$$

In this case, $U_{GS8}$ represents the gate-source voltage of the transistor 8 and $R_{12}$ represents the value of the resistor 12.

In addition, the simplicity of the reference current generation affords the advantage of the low required components and thus a significant saving of chip area. The improved supply voltage rejection of the reference current additionally leads to the advantage of an improved signal quality at the output of the bandgap reference circuit.

The start circuit 19, 20, 21 comprises just three MOS transistors and, like the rest of the bandgap reference circuit, is designed for particularly low supply voltages $V_{DD}$. Transistor 19 is driven in a manner dependent on the voltage level present at the first tapping point 15. In this case, it must be taken into account that the transistor 21 is always somewhat in the on state. The second transistor 20 controls the transistor 7 by drawing current. As soon as the reference voltage generation has started and a specific current flow has been achieved in the circuit, the transistor 19 is turned on and the transistor 20 is accordingly switched off at its gate. Consequently, the start circuit functions particularly effectively with simple means.

On account of the improved voltage supply rejection and on account of the low supply voltage possible, the present circuit is particularly suitable for application in mobile devices that are fed from rechargeable batteries. It is particularly advantageous in devices of this type where there are comparatively large fluctuations in the supply voltage.

In an advantageous manner, the present bandgap reference circuit is completely constructed using CMOS circuit technology and can thus be used in particular for use in double data rate synchronous dynamic random access memories (DDR-SDRAMs) and other semiconductor memories as well as in mobile radio, such as, by way of example, in Bluetooth or DECT (Digital European Cordless Telephone) devices.

The bandgap reference circuit presented still functions reliably at supply voltages of 1.3 volts.

Instead of the diodes 3, 5 shown, the forward voltage of which serves as a reference for the bandgap reference circuit, it is also possible to use transistors, in which the base-emitter junctions then serve as a reference basis through short-circuiting of base and collector.

Instead of the MOS transistors shown in FIG. 1, within the scope of the invention it is also possible, of course, to use other transistor types with in each case customary technical circuitry.

FIG. 2 shows the frequency response of the supply voltage rejection PSRR of the reference current IREF of the differential amplifier on the basis of a graph in a logarithmic representation. In this case, the supply voltage rejection of the reference current of the differential amplifier from FIG. 1 is plotted in dB (A) against the frequency in hertz. Curve N describes the frequency response of the circuit of FIG. 1, while curve O characterizes the frequency response of the already known bandgap reference circuit mentioned in the background. An improvement of the supply voltage rejection with the circuit presented of up to 20 dB is produced in the medium frequency range between 100 kHz and 100 MHz, which is particularly important technically.

FIG. 3 shows the frequency response of the supply voltage rejection of the bandgap circuit of FIG. 1 overall on the basis of a graph in a logarithmic representation. In this case, the supply voltage rejection PSRR of the bandgap voltage VBG generated at the output of the circuit is plotted against the frequency in hertz. Here, too, curve N describes the behavior of the circuit of FIG. 1, while curve O relates to the known bandgap circuit mentioned in the introduction. An improved supply voltage rejection of approximately 3 dB is produced over a wide frequency range.

FIG. 4 shows a further exemplary embodiment of a bandgap reference circuit that is constructed using CMOS circuit technology and uses the forward voltage of diodes as a voltage reference. This circuit largely corresponds to that of FIG. 1 in terms of construction and functioning and in this respect will not be repeated once again at this juncture. Instead of the resistor 12 of FIG. 1, a transistor 22 is provided in the case of FIG. 4, the control terminal of said transistor, for the purpose of setting the conductivity, being connected to one of a set of suitable circuit nodes of the reference circuit.

Suitable circuit nodes of this type include, by way of example, the tapping nodes 15, 16, but equally the node A connecting the transistors 8 and 9 or the output node B, C of the bandgap reference circuit upstream or downstream of the low-pass filter 17, 18.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A bandgap reference circuit, comprising:
    a first current path comprising a current input, a first diode and a first tapping node for tapping off a voltage dependent on a forward voltage of the first diode;
    a second current path comprising a current input, a resistor, a second diode and a second tapping node for tapping off a voltage dependent on the forward voltage of the second diode;
    a differential amplifier comprising a first input, which is connected to the first tapping node, a second input, which is connected to the second tapping node, a bias current input and an output, which is coupled to the current inputs of the first and second current paths and at which a signal dependent on a voltage difference at the first and second inputs is provided; and
    a resistance connected between the bias current input of the differential amplifier and a reference potential, and configured to provide a reference current for the differential amplifier.

2. The bandgap reference circuit of claim 1, further comprising a start circuit configured to activate the bandgap reference circuit, the start circuit comprising:
    a first transistor having a control input, which is connected to the first tapping node, and having a controlled path, which connects an electrical load to the reference potential terminal; and
    a second transistor having a control input, which is connected to the controlled path of the first transistor and, on a load side, selectively couples the output of the differential amplifier to the reference potential.

3. The bandgap reference circuit of claim 2, wherein the electrical load in the start circuit comprises a transistor that couples a supply potential terminal to a terminal of the controlled path of the first transistor.

4. The bandgap reference circuit of claim 1, wherein the first current path comprises a series circuit comprising a first resistor, a second resistor and the first diode, wherein the first tapping node is arranged between the first and second resistors, and wherein the second tapping node for the second current path is between the resistor and second diode therein.

5. The bandgap reference circuit claim 1, wherein the differential amplifier comprises a first and a second amplifier transistor, having control inputs, which form the first and second inputs of the differential amplifier, wherein the first and second amplifier transistors are connected by a respective terminal of a controlled path thereof to the bias current input of the differential amplifier, and the other respective terminals of the controlled paths of the amplifier transistors are connected to one another through a current mirror.

6. The bandgap reference circuit of claim 1, further comprising a control transistor configured to couple an output of the differential amplifier to the current inputs of the first and second current paths, wherein the control transistor comprises a control input connected to the output of the differential amplifier, and having a controlled path, which selectively couples a supply potential terminal to the two current inputs of the first and second current paths and to an output of the bandgap reference circuit.

7. The bandgap reference circuit of claim 6, further comprising a low-pass filter connected to the output of the bandgap reference circuit.

8. The bandgap reference circuit of claim 1, wherein the resistance connected between the bias current input of the differential amplifier and the reference potential terminal configured to provide the reference current for the differential amplifier comprises a transistor.

9. A bandgap reference circuit, comprising:
    a differential amplifier circuit comprising first and second inputs coupled to respective control inputs of a differential transistor pair, a current mirror circuit coupled to respective first terminals of the differential transistor pair, and a current bias circuit coupled to respective second terminals of the differential transistor pair, wherein the bias circuit comprises a resistance coupled between the second terminals of the differential transistor pair and a reference potential;
    a control transistor comprising a control terminal coupled to an output of the differential amplifier circuit, a first terminal coupled to a supply potential, and a second terminal;
    a first current path coupled to the second terminal of the control transistor, comprising a first diode and a first tap node, wherein a voltage is provided at the first tap node that is dependent on a forward voltage of the first diode; and
    a second current path coupled to the second terminal of the control transistor comprising a second diode and a second tap node, wherein a voltage is provided at the second tap node that is dependent on a forward voltage of the second diode,
    wherein the first and second tap nodes are coupled to the first and second inputs of the differential amplifier circuit, respectively.

10. The bandgap reference circuit of claim 9, wherein the resistance in the differential amplifier circuit comprises a resistor.

11. The bandgap reference circuit of claim 9, wherein the resistance comprises a transistor having a control terminal and a first terminal coupled to the second terminals of the differential transistor pair, and a second terminal coupled to the reference potential.

12. The bandgap reference circuit of claim 9, wherein the first current path comprises a first resistance coupled between the second terminal of the control transistor and the first tap node, a second resistance coupled between the first tap node and the first diode, and wherein the first diode is coupled between the second resistance and the reference potential.

13. The bandgap reference circuit of claim 9, wherein the second current path comprises a third resistance coupled between the second terminal of the control transistor and the second tap node, and wherein the second diode is coupled between the second tap node and the reference potential.

14. The bandgap reference circuit of claim 9, further comprising a start circuit coupled to the control terminal of the control transistor, wherein the start circuit is configured to activate the bandgap reference circuit.

15. The bandgap reference circuit of claim 14, wherein the start circuit comprises:

a first transistor comprising a control terminal coupled to the first tap node, a first terminal, and a second terminal coupled to the reference potential;

a load coupled between the first terminal of the first transistor; and the supply potential; and a second transistor having a control terminal coupled to the first terminal of the first transistor, a first terminal coupled to the control terminal of the control transistor, and a second terminal coupled to the second terminal of the first transistor.

* * * * *